(12) United States Patent
Kunishima et al.

(10) Patent No.: US 9,478,547 B2
(45) Date of Patent: Oct. 25, 2016

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Hiroyuki Kunishima, Kanagawa (JP); Masashige Moritoki, Kanagawa (JP); Toshiji Taiji, Kanagawa (JP); Youichi Yamamoto, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/729,395

(22) Filed: Jun. 3, 2015

(65) Prior Publication Data

US 2015/0357335 A1 Dec. 10, 2015

(30) Foreign Application Priority Data

Jun. 9, 2014 (JP) ................................ 2014-119047

(51) Int. Cl.
*H01L 27/04* (2006.01)
*H01L 27/108* (2006.01)

(52) U.S. Cl.
CPC ... *H01L 27/10814* (2013.01); *H01L 27/10852* (2013.01); *H01L 27/10817* (2013.01)

(58) Field of Classification Search
None
See application file for complete search history.

(56) References Cited

U.S. PATENT DOCUMENTS

| 6,255,151 | B1 | 7/2001 | Fukuda et al. |
| 8,258,039 | B2 | 9/2012 | Inoue |
| 8,390,046 | B2 | 3/2013 | Kawahara et al. |
| 8,624,328 | B2 | 1/2014 | Kawahara et al. |
| 8,633,565 | B2* | 1/2014 | Song ................... H01L 23/5256 257/529 |
| 8,648,441 | B2 | 2/2014 | Hijioka et al. |
| 8,890,289 | B2 | 11/2014 | Manabe et al. |
| 8,946,800 | B2 | 2/2015 | Kume et al. |
| 2012/0193760 | A1* | 8/2012 | Manabe ............ H01L 27/10814 257/532 |
| 2013/0056850 | A1* | 3/2013 | Kume ............... H01L 27/10808 257/532 |
| 2013/0092993 | A1 | 4/2013 | Hijioka et al. |

FOREIGN PATENT DOCUMENTS

| JP | 2004-342787 A | 12/2004 |
| JP | 2005-101647 A | 4/2005 |
| JP | 2011-014731 A | 1/2011 |
| JP | 2011-054920 A | 3/2011 |
| JP | 2011-114049 A | 6/2011 |
| JP | 2012-004533 A | 1/2012 |
| JP | 2012-160492 A | 8/2012 |
| JP | 2012-160493 A | 8/2012 |
| JP | 2013-055203 A | 3/2013 |
| JP | 2013-089712 A | 5/2013 |

* cited by examiner

*Primary Examiner* — Ali Naraghi
(74) *Attorney, Agent, or Firm* — Shapiro, Gabor and Rosenberger, PLLC

(57) ABSTRACT

Dishing of a plate of a capacitor is suppressed in a structure where the top of the plate is flush with a top of an interconnection. Double interlayer dielectric films are used to form a first recess and a second recess. The second recess has an opening on the bottom of the first recess. The first and second recesses are used to form a capacitor. The lower electrode of the capacitor has a bottom part along the bottom of the first recess. The lower electrode further includes a sidewall part having an upper end that projects along a side face of the second recess from the opening of the second recess up to a position between the opening of the second recess and a top of the upper interlayer dielectric film (the upper one of the double interlayer dielectric films).

9 Claims, 15 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2014-119047 filed on Jun. 9, 2014 including the specification, drawings and abstract is incorporated herein by reference in its entirety.

BACKGROUND

The present invention relates to a semiconductor device and a method of manufacturing the semiconductor device, which is technology usable for a semiconductor device including an interconnection layer having a capacitor, for example.

The capacitor is an electronic element that accumulates charges therein, and, for example, used in a dynamic random access memory (DRAM). Such a capacitor may be required to have high capacitance. The capacitor has a larger capacitance with an increase in its surface area. Hence, the capacitor may be increased in surface area so as to have a larger capacitance.

On the other hand, a semiconductor chip is now required to have smaller area. When a capacitor is provided in such a semiconductor chip, the capacitor must have a small planar configuration. So, the capacitor may now be provided in a recess of an interconnection layer as described in, for example, Japanese Unexamined Patent Application Publication Nos. 2011-14731, 2004-342787, 2005-101647, 2011-54920, 2011-114049, 2012-160492, 2012-160493, 2013-55203, 2013-89712, and 2012-4533. Such a capacitor has a large surface area thanks to the inner side face of the recess, and has a small planar configuration.

In addition, Japanese Unexamined Patent Application Publication No. 2012-4533 (JP-A-2012-4533) describes the following capacitor. The capacitor is formed using a first recess provided on a surface of an interlayer dielectric film included in an interconnection layer, and a second recess provided on the bottom of the first recess. Specifically, the lower electrode of the capacitor is provided along the bottom and the side face of the second recess. The lower electrode is covered with a capacitive dielectric film and an upper electrode of the capacitor. Furthermore, a conductive plate is located over the upper electrode. The interlayer dielectric film has an interconnection provided in a region different from the region having the capacitor. The top of the interconnection is flush with the top of the conductive plate. JP-A-2012-4533 describes that such a structure improves flatness of the interconnection layer.

SUMMARY

While lithography is necessarily used to form the capacitor having the plate in the interconnection layer, the number of times of such lithography is preferably smaller. Other issues and novel features will be clarified from the description of this specification and the accompanying drawings.

In a semiconductor device according to one embodiment of the present invention, a second interlayer dielectric film is located over a first interlayer dielectric film. A first recess and a second recess are formed using the first interlayer dielectric film and the second interlayer dielectric film. The second recess has an opening on the bottom of the first recess. A capacitor is formed using the first recess and the second recess. The lower electrode of the capacitor has a bottom along the bottom of the second recess. Furthermore, the lower electrode has a sidewall part having an upper end that projects along the side face of the second recess from the opening of the second recess up to a position between the opening of the second recess and the top of the second interlayer dielectric film.

In a method of manufacturing a semiconductor device according to another embodiment of the invention, a second interlayer dielectric film is formed over a first interlayer dielectric film. A second recess is then formed using the first interlayer dielectric film and the second interlayer dielectric film. A first conductive film is then formed along the bottom and the side face of the second recess and the top of the second interlayer dielectric film. Subsequently, a resist pattern having an opening, which internally has the second recess in a plan view, is formed while the second recess is filled with a resist. The first conductive film is then partially removed by etching using the resist pattern as a mask, thereby a lower electrode is formed, and a first recess is formed in the second interlayer dielectric film.

According to the above-described respective embodiments of the invention, it is possible to decrease the number of times of lithography for forming a capacitor having a plate in an interconnection layer.

DETAILED DESCRIPTION

Figure 1:
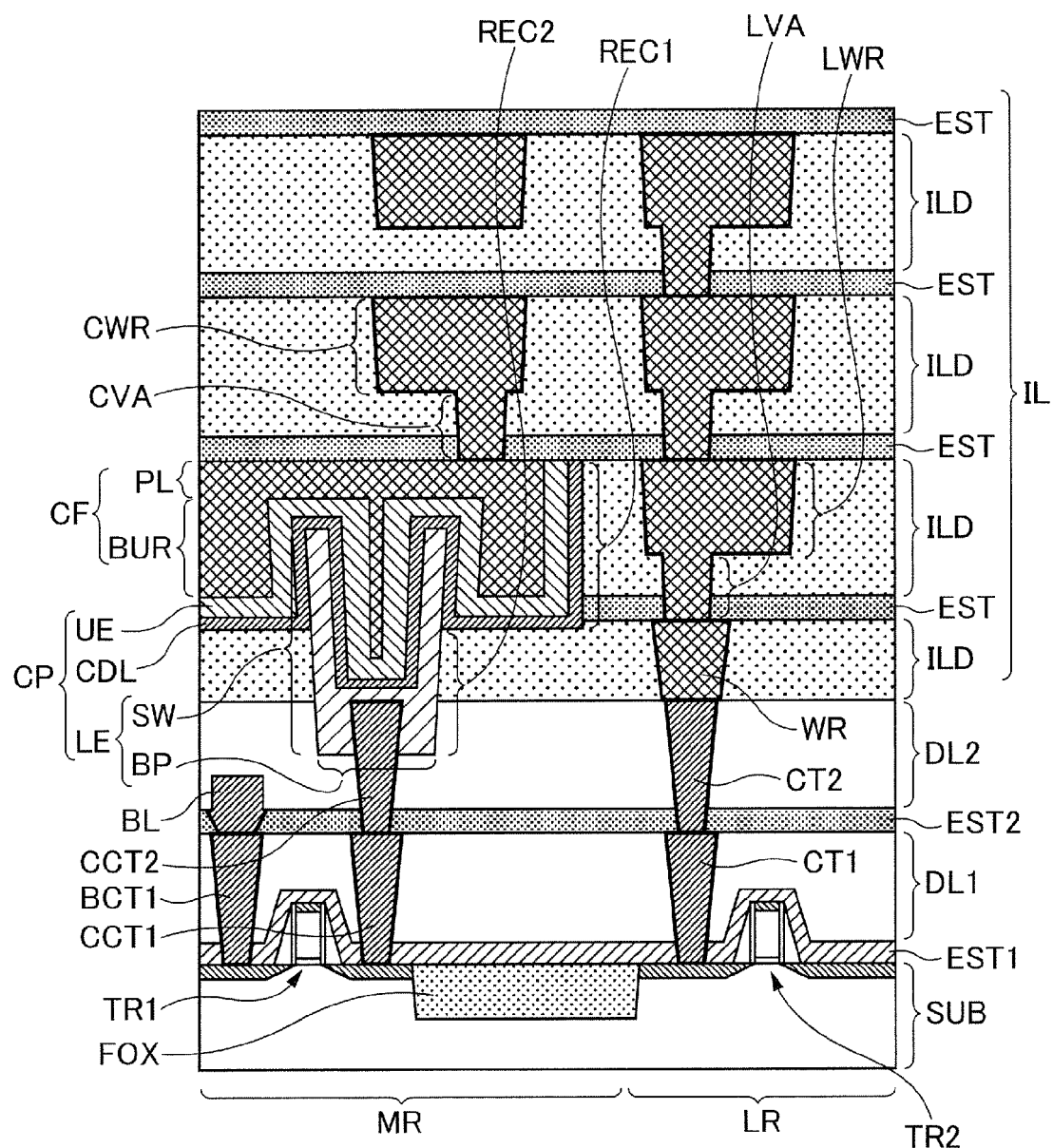
FIG. 1 is a sectional view illustrating a configuration of a semiconductor device according to a first embodiment.

Hereinafter, some embodiments are described with reference to accompanying drawings. In all the drawings, like components are designated by like numerals, and duplicated description is appropriately omitted.
First Embodiment FIG. 1 is a sectional view illustrating a configuration of a semiconductor device SD according to a first embodiment. In the semiconductor device SD, a memory cell and a logic circuit are combined over a substrate SUB. Specifically, the substrate SUB has a memory region MR and a logic region LR. The semiconductor device SD has the memory cell over the memory region MR and the logic region over the logic region LR. The semiconductor device SD includes, for example, a semiconductor substrate (for example, a silicon substrate) or a silicon on insulator (SOI) substrate.

The memory cell includes a transistor TR1 and a capacitor CP. The capacitor CP is electrically coupled to one of the source and the drain of the transistor TR1. A bit line BL is electrically coupled to the other of the source and the drain of the transistor TR1. On the other hand, the logic circuit includes a transistor TR2. In the exemplary case illustrated in FIG. 1, the transistors TR1 and TR2 are isolated from each other by a field oxide film FOX (an element isolating layer). The field oxide film FOX is formed by, for example, shallow trench Isolation (STI) or local oxidation of Silicon (LOCOS).

The transistor TR2 is not limited to a transistor as a component of a logic circuit. The transistor TR2 may be a component of a peripheral circuit over the memory region MR. In other words, the transistor TR2 may be a component of a circuit that controls the transistor TR1. Such a circuit employs a transistor having a structure similar to that of the transistor in the logic circuit.

The transistor TR1 is coupled to the capacitor CP via contacts CCT1 and CCT2. An etching stop layer EST1, a dielectric film DL1, an etching stop layer EST2, and a dielectric film DL2 are stacked in order of closeness to the substrate SUB between the transistor TR1 (substrate SUB) and the capacitor CP. The contact CCT1 is provided in the dielectric film DL1 while extending through the dielectric film DL1 and the etching stop layer EST1. The contact CCT2 is provided in the dielectric film DL2 while extending through the dielectric film DL2 and the etching stop layer EST2. The bit line BL is provided in the dielectric film DL2. Furthermore, the bit line BL is coupled to the transistor TR1 via a contact BCT1 provided in the dielectric film DL1.

An interconnection layer IL is provided over the dielectric film DL2. In the interconnection layer IL, an interlayer dielectric film ILD and an etching stop layer EST are repeatedly stacked in this order. To describe in detail later, a recess REC1 (first recess) and a recess REC2 (second recess) are provided in the interconnection layer IL. The capacitor CP is formed using the recess REC1 and the recess REC2.

In the exemplary case illustrated in FIG. 1, the interconnection layer IL has an interconnection CWR and a via CVA in the interlayer dielectric film ILD over the memory region MR. Specifically, the interconnection CWR and the via CVA are provided in the interlayer dielectric film ILD over the capacitor CP while being electrically coupled to the capacitor CP. The via CVA is coupled to the bottom part of the interconnection CWR. The interconnection CWR and the via CVA are formed by dual damascene, for example.

Furthermore, the interconnection layer IL has an interconnection WR, interconnections LWR, and vias LVA over the login region LR. The interconnection WR is provided in the lowest interlayer dielectric film ILD in the interconnection layer IL. The interconnection WR is electrically coupled to the source or drain of the transistor TR2 via contacts CT1 and CT2 provided in the dielectric films DL1 and DL2 (dielectric films located under the interconnection layer IL), respectively. The interconnection LWR and the via LVA are provided in each of the interlayer dielectric films ILD located above the interconnection WR. Furthermore, the interconnection LWR and the via LVA are coupled to the transistor TR2 via the interconnection WR and the contacts CT1 and CT2. The interconnection LWR and the via LVA are formed by, for example, dual damascene as with the interconnection CWR and the via CVA.

The interlayer dielectric film ILD is composed of, for example, a silicon oxide ($SiO_2$) film or a low-k film (for example, SiOC film). The etching stop layer EST is configured of, for example, a silicon nitride (SiN) film or a silicon carbonitride (SiCN) film.

Figure 2:
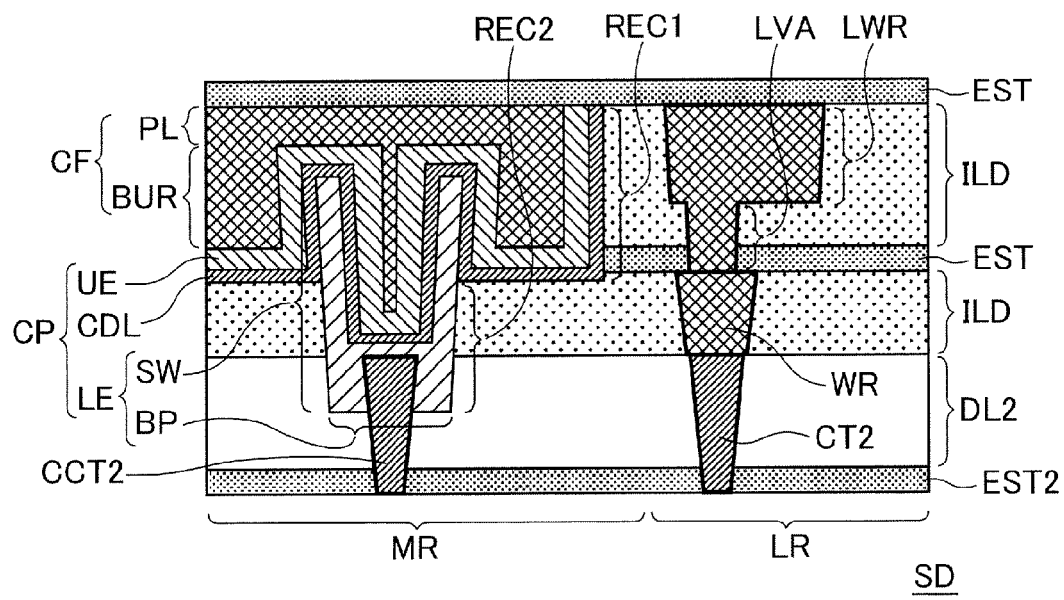
FIG. 2 is an expanded view of a major part of FIG. 1.

FIG. 2 is an expanded view of a major part of FIG. 1. In the exemplary case illustrated in FIG. 2, the recesses REC1 and REC2 are provided in the double interlayer dielectric films ILD located lowest in the interconnection layer IL. However, the recesses REC1 and REC2 are not limitedly provided at the position illustrated in FIG. 2. For example, the recesses REC1 and REC2 may be provided in a layer above the double films lowest in the interconnection layer IL.

The recess REC1 extends through the upper interlayer dielectric film ILD (second interlayer dielectric film) of the double interlayer dielectric films ILD. Furthermore, the bottom part of the recess REC1 extends through the etching stop layer EST located between the double interlayer dielectric films ILD. However, the bottom part of the recess REC1 may not extend through the etching stop layer EST. For example, the recess REC1 may merely extend into the etching stop layer EST, or the bottom part thereof may be located above the top of the etching stop layer EST.

The recess REC2 has an opening on the bottom of the recess REC1. The recess REC2 extends through the lower interlayer dielectric film ILD (first interlayer dielectric film) of the double interlayer dielectric films ILD. Furthermore, in the exemplary case illustrated in FIG. 2, the bottom part of the recess REC2 extends into the dielectric film DL2 (dielectric film located under the interconnection layer IL). However, the bottom part of the recess REC2 may not extend into the dielectric film DL2. For example, the bottom part of the recess REC2 may be located above the top of the dielectric film DL2. In other words, the recess REC2 may not extend through the interlayer dielectric film ILD.

Although each of the recesses REC1 and REC2 extends through only one interlayer dielectric film ILD in the exemplary case illustrated in FIG. 2, the recesses REC1 and REC2 may not be limitedly configured in such a manner. For example, the recess REC1 may extend through a plurality of the interlayer dielectric films ILD. The recess REC2 may also extend through a plurality of the interlayer dielectric films ILD.

The capacitor CP is formed using the recesses REC1 and REC2. Specifically, the capacitor CP has a lower electrode LE, a capacitive dielectric film CDL, an upper electrode UE, and a conductive film CF.

The lower electrode LE has a bottom part BP and a sidewall part SW. The bottom part BP is provided along the bottom part of the recess REC2. The bottom part BP is coupled to the contact CCT2. The sidewall part SW has an upper end projecting from the opening of the recess REC2 along the side face of the recess REC2. The upper end extends up to a point between the opening of the recess REC2 and the top of the interlayer dielectric film ILD (the interlayer dielectric film ILD having the recess REC1). The lower electrode LE is composed of, for example, titanium nitride (TiN). However, the material for the lower electrode LE is not limited thereto. A portion of the sidewall part SW, the portion projecting from the opening of the recess REC2, has a height of 10 to 500 nm, for example.

The capacitive dielectric film CDL covers the bottom part BP of the lower electrode LE and the inner wall of the sidewall part SW of the lower electrode LE. The capacitive dielectric film CDL further covers a portion of the sidewall part SW of the lower electrode LE, the portion projecting from the opening of the recess REC2. In the exemplary case illustrated in FIG. 2, the capacitive dielectric film CDL is provided along the bottom part BP of the lower electrode LE and along the inner and outer walls of the sidewall part SW of the lower electrode LE. The capacitive dielectric film CDL is composed of, for example, a high-k material (for example, zirconia ($ZrO_2$)). However, the material for the capacitive dielectric film CDL is not limited thereto.

The upper electrode UE covers the capacitive dielectric film CDL. In the exemplary case illustrated in FIG. 2, as with the capacitive dielectric film CDL, the upper electrode UE is provided along the bottom part BP of the lower electrode LE and along the inner and outer walls of the sidewall part SW of the lower electrode LE. In the first embodiment, the upper electrode UE is composed of a stacked film (Ta/TaN/W/TiN) including titanium nitride (TiN), tungsten (W), tantalum nitride (TaN), and tantalum (Ta) stacked in order of closeness to the capacitive dielectric film CDL. However, the material for the upper electrode UE is not limited thereto.

The conductive film CF covers the upper electrode UE of the capacitor CP. The conductive film CF is provided as a flat plate PL over the upper electrode UE. The plate PL has a thickness of, for example, 10 to 300 nm. The top of the plate PL is flush with the top of an interconnection (interconnection LWR) located in the same layer as the plate PL. The conductive film CF forms a filled part BUR in a space located under the plate PL (for example, a space between the projecting portion of the sidewall part SW of the lower electrode LE (projecting portion from the opening of the recess REC2) and the side face of the recess REC1), which fills the space. In the first embodiment, the conductive film CF is composed of copper alloy. However, the material for the conductive film CF is not limited thereto.

The upper electrode UE may fill the filled part BUR (for example, a recess formed by the inner side face of the lower electrode LE) depending on thicknesses of the upper electrode UE. In such a case, the conductive film CF does not fill the filled part BUR. The conductive film CF forms the plate PL over the filled part BUR.

In FIG. 2, one recess REC2 is shown for one recess REC1 for illustrative purposes. However, a plurality of recesses REC2 may be provided for one recess REC1. In such a case, the lower electrode LE is provided for each of the recesses REC2. However, the capacitive dielectric film CDL and the upper electrode UE are each provided across the recesses REC2. In other words, a plurality of capacitors CP individually provided for the recesses REC2 share the capacitive dielectric film CDL and the upper electrode UE. Furthermore, one plate PL is provided for the plurality of capacitors CP.

FIGS. 3 to 16 are each a sectional view illustrating a method of manufacturing the semiconductor device SD illustrated in FIGS. 1 and 2. First, the field oxide film FOX (element isolating layer) and the transistors TR1 and TR2 are formed in the substrate SUB illustrated in FIG. 1.

In detail, first, the field oxide film FOX is formed in the substrate SUB. Subsequently, a gate dielectric film and a gate electrode are formed in the substrate SUB. Subsequently, impurities are implanted into the substrate SUB with the gate electrode and the field oxide film FOX as a mask. Consequently, a lightly-doped drain (LDD) and a lightly-doped source (LDS) are formed in the substrate SUB. Subsequently, a dielectric film to be a sidewall is formed over the substrate SUB and the gate electrode, which is then etched back. Consequently, the sidewall is formed. Subsequently, impurities are implanted into the substrate SUB with the sidewall, the gate electrode, and the field oxide film FOX as a mask. Consequently, sources and drains are formed in the substrate SUB.

Subsequently, the etching stop layer EST1 and the dielectric film DL1 are formed over the substrate SUB, the field oxide film FOX, and the transistors TR1 and TR2. The etching stop layer EST1 includes, for example, a silicon nitride (SiN) film. The dielectric film DL1 includes, for example, a silicon oxide ($SiO_2$) film. Subsequently, the contacts BCT1, CCT1, and CT1 are formed in the dielectric film DL1 in an embedded manner. Such contacts are each composed of, for example, tungsten (W). Subsequently, the etching stop layer EST2 is provided over the dielectric film DL1 and the contacts. Subsequently, the bit line BL is formed through the etching stop layer EST2 so as to be coupled to the contact BCT1.

Subsequently, the dielectric film DL2 is formed over the bit line BL and the etching stop layer EST2. Subsequently, the contact CCT2 and the contact CT2 are each formed through the etching stop layer EST2. The contact CCT2 is formed so as to be coupled to the contact CCT1, while the contact CT2 is formed so as to be coupled to the contact CT1.

Figure 3:
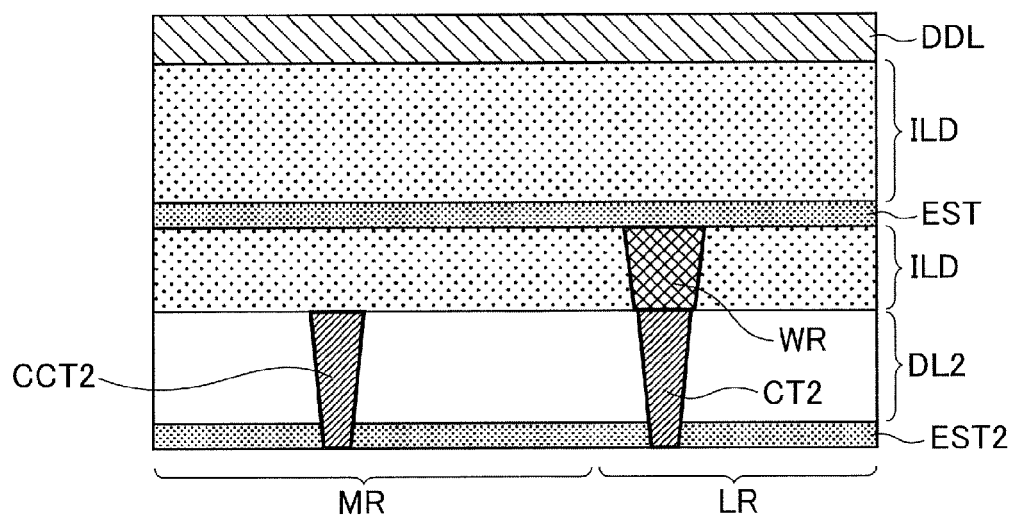
FIG. 3 is a sectional view illustrating a method of manufacturing the semiconductor device illustrated in FIGS. 1 and 2.

Subsequently, as illustrated in FIG. 3, the interlayer dielectric film ILD is formed over the contacts CCT2 and CT2 and the dielectric film DL2. The interconnection WR is formed through the interlayer dielectric film ILD. Subsequently, the etching stop layer EST is formed over the interconnection WR and the interlayer dielectric film ILD. Subsequently, the interlayer dielectric film ILD is formed over the etching stop layer EST. Subsequently, a dielectric film DDL is formed over the interlayer dielectric film ILD. The dielectric film DDL includes, for example, a silicon oxide ($SiO_2$) film.

Figure 4:
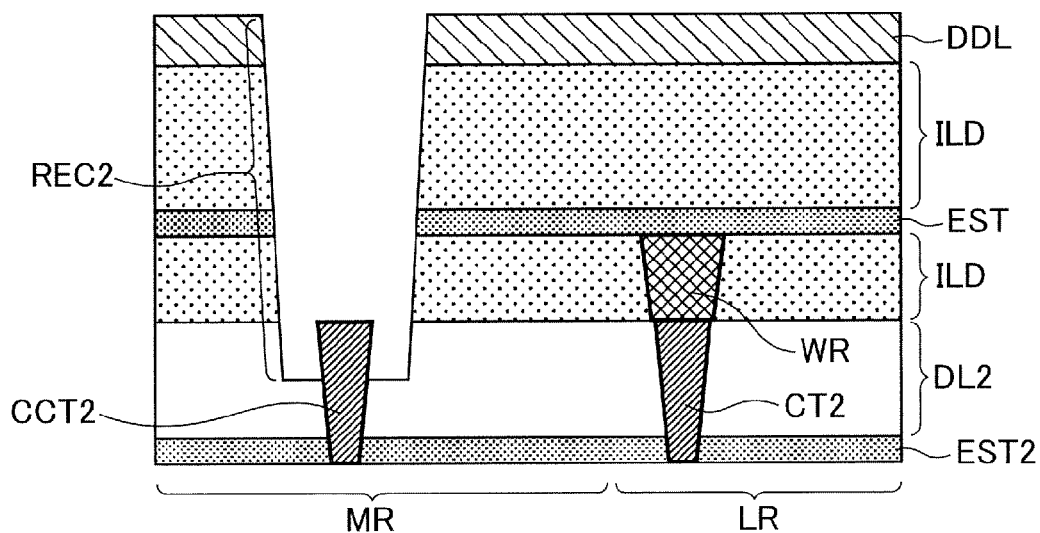
FIG. 4 is a sectional view illustrating the method of manufacturing the semiconductor device illustrated in FIGS. 1 and 2.

Subsequently, as illustrated in FIG. 4, the recess REC2 is formed in the interlayer dielectric film ILD over the memory region MR. In the exemplary case illustrated in FIG. 4, the recess REC2 extends through the double interlayer dielectric films ILD, and the bottom part thereof extends into the dielectric film DL2. The upper part of the contact CCT2 is located in the bottom part of the recess REC2.

Figure 5:
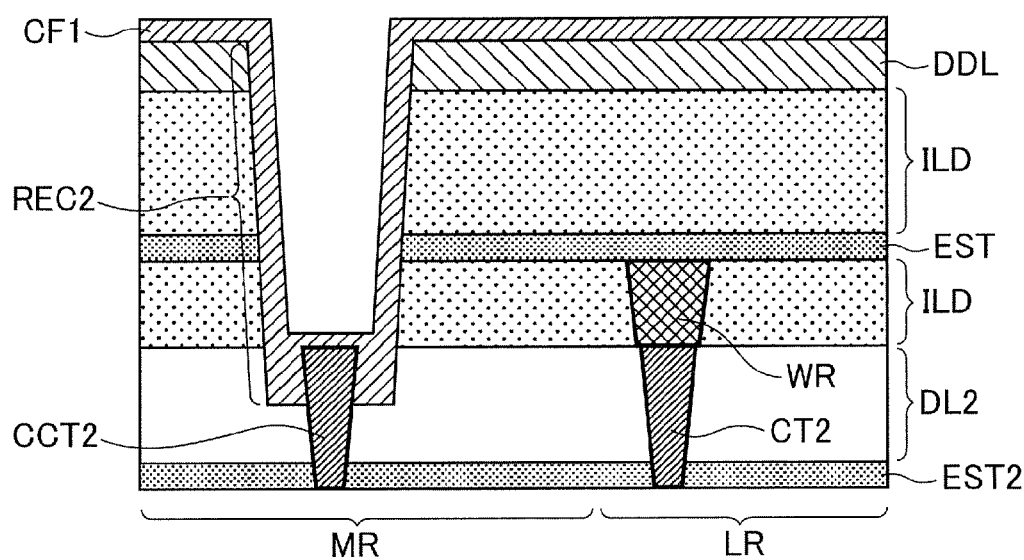
FIG. 5 is a sectional view illustrating the method of manufacturing the semiconductor device illustrated in FIGS. 1 and 2.

Subsequently, as illustrated in FIG. 5, the conductive film CF1 (first conductive film) is formed over the recess REC2 and the dielectric film DDL. Consequently, the conductive film CF1 is provided along the bottom and the side face of the recess REC2 and along the top of the dielectric film DDL. The conductive film CF1 is formed by, for example, sputtering, atomic layer deposition (ALD), or metal organic chemical vapor deposition (MOCVD). As described in detail later, the conductive film CF1 acts as the lower electrode LE of the capacitor CP. The conductive film CF1 is composed of, for example, titanium nitride (TiN).

Figure 6:
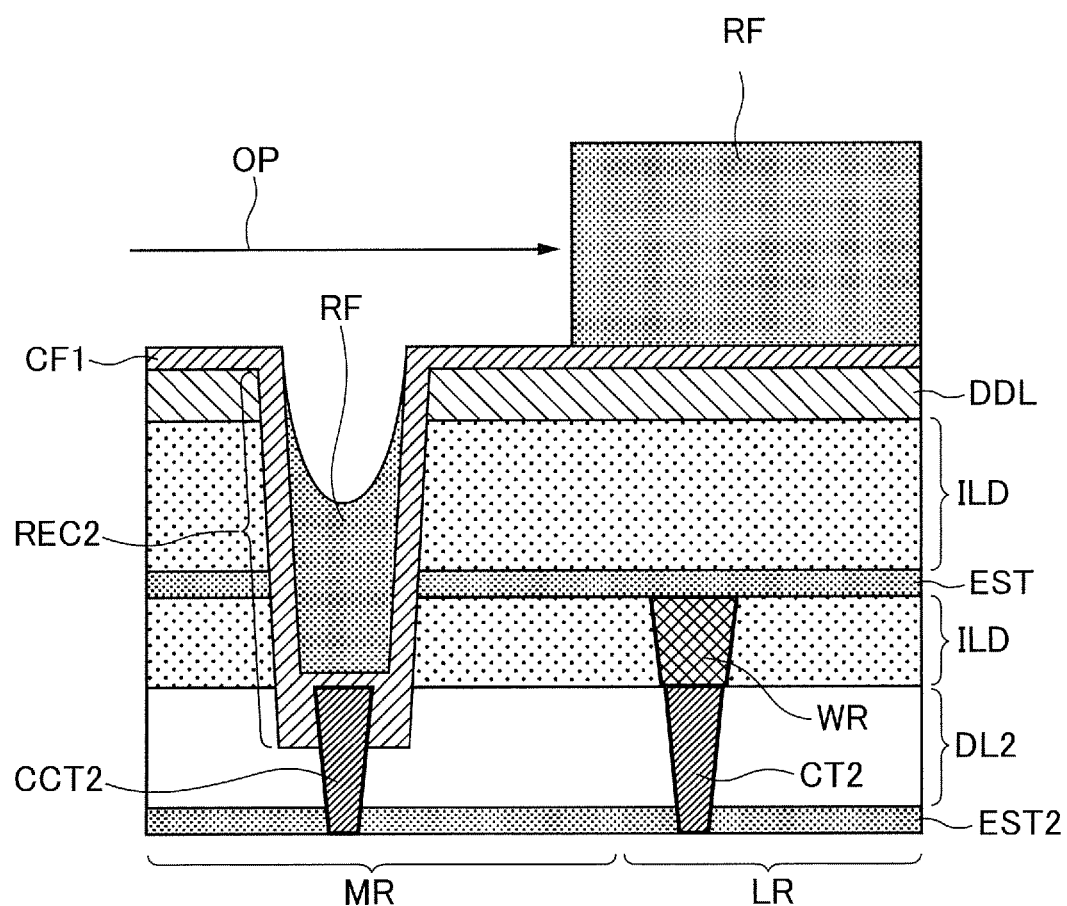
FIG. 6 is a sectional view illustrating the method of manufacturing the semiconductor device illustrated in FIGS. 1 and 2.

Subsequently, as illustrated in FIG. 6, a resist pattern, which has an opening OP internally including the recess REC2 in a plan view, is formed while some of the resist film RF fills the recess REC2. Such a resist pattern is formed, for example, in the following manner. First, a resist is applied onto the entire surface of the conductive film CF1. In this operation, some of the resist fills the recess REC2. Subsequently, the opening OP is formed in the resist by lithography. At this time, the resist filling the recess REC2 is not removed except for the upper part thereof. Thus, as illustrated in FIG. 6, the recess REC2 internally has a resist film RF having a top bowed toward the bottom part of the recess REC2.

Figure 7:
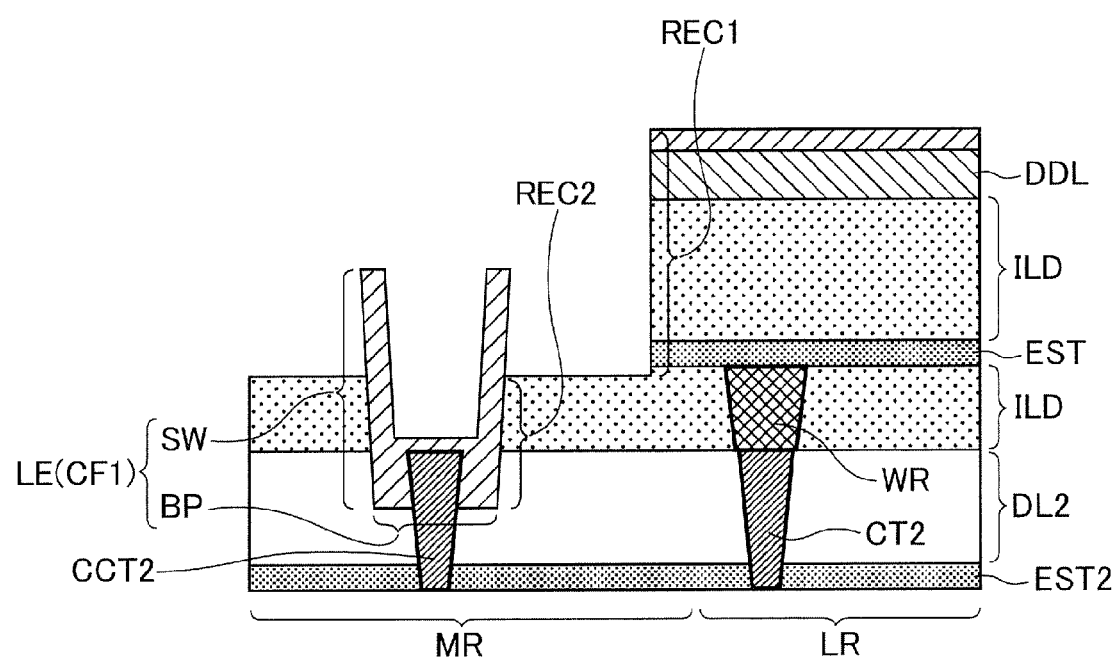
FIG. 7 is a sectional view illustrating the method of manufacturing the semiconductor device illustrated in FIGS. 1 and 2.

Subsequently, as illustrated in FIG. 7, etching is performed using the resist pattern as a mask, so that the conductive film CF1 is partially removed, and the recess REC1 is formed in the interlayer dielectric film ILD. In other words, partial removal of the conductive film CF1 and formation of the recess REC1 are performed together. Consequently, the conductive film CF1 remaining over the memory region MR functions as the lower electrode LE. For example, reactive ion etching (RIE) is performed as the etching. Subsequently, the resist pattern is removed by, for example, asking.

In the exemplary case illustrated in FIG. 7, the etching is continuously performed up to removal of the etching stop layer EST located on the bottom of the interlayer dielectric film ILD, in which the opening of the recess REC1 is formed. In the case, each of the dielectric film DDL, the interlayer dielectric film ILD, and the etching stop layer EST has an etching rate higher than that of the lower electrode LE in a thickness direction of the interlayer dielectric film ILD. As a result, the bottom of the recess REC1 is located below the upper end of the lower electrode LE.

Figure 8:
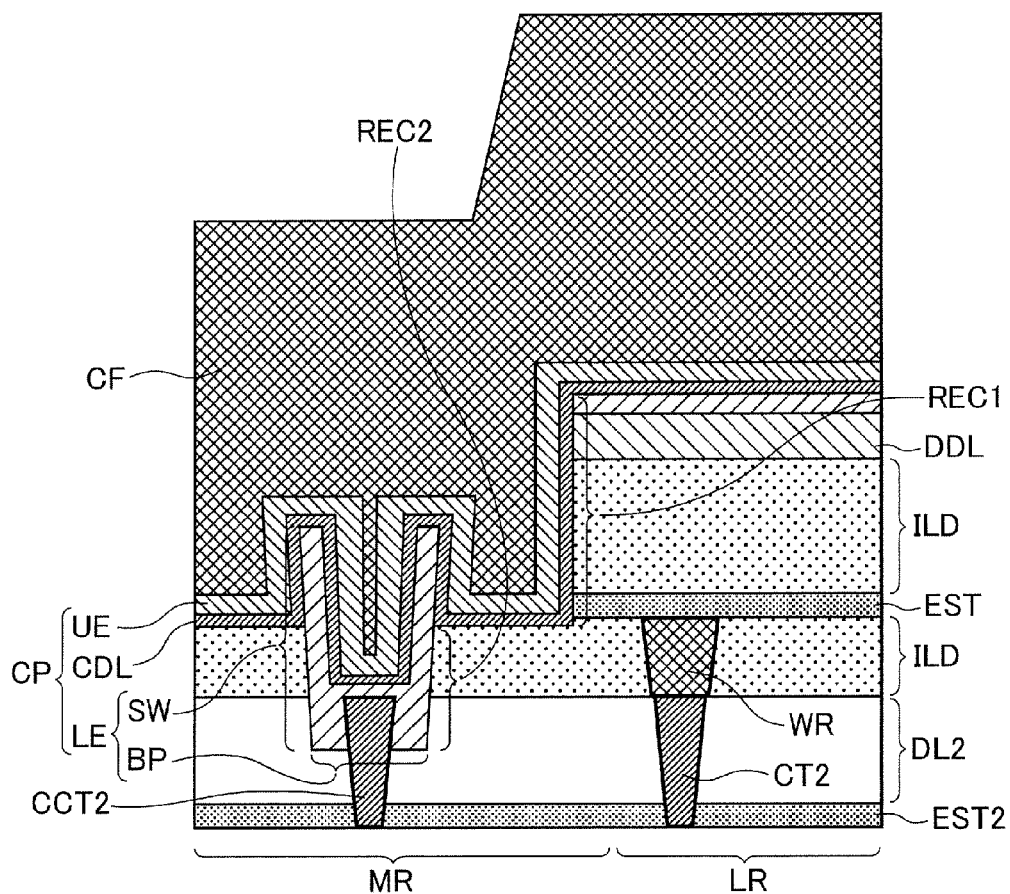
FIG. 8 is a sectional view illustrating the method of manufacturing the semiconductor device illustrated in FIGS. 1 and 2.

Subsequently, as illustrated in FIG. 8, the capacitive dielectric film CDL, the upper electrode UE, and the conductive film CF (second conductive film) are stacked in this order. The capacitive dielectric film CDL, the upper electrode UE, and the conductive film CF are each formed by, for example, sputtering, ALD, or MOCVD. In the first embodiment, the conductive film CF is composed of copper alloy as described above.

Figure 9:
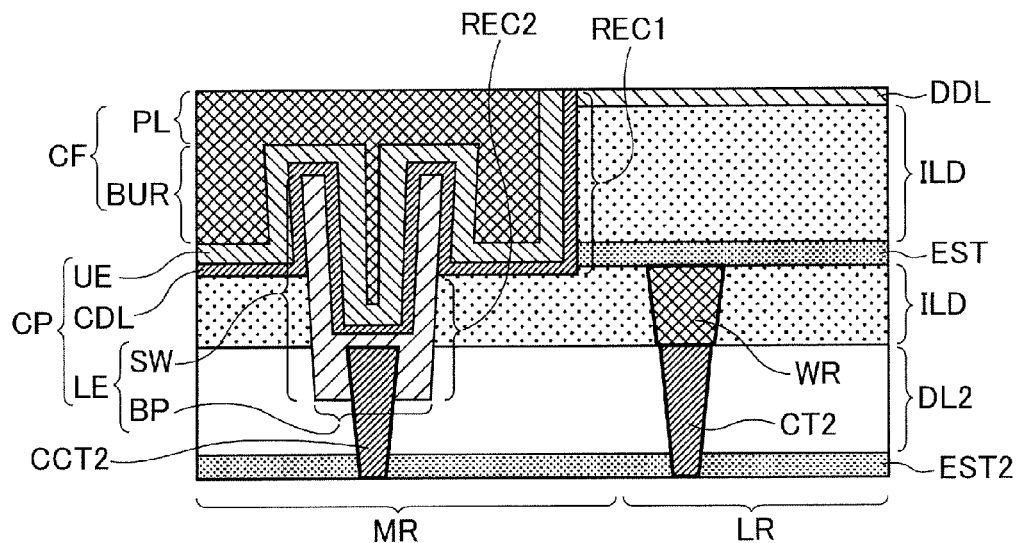
FIG. 9 is a sectional view illustrating the method of manufacturing the semiconductor device illustrated in FIGS. 1 and 2.

Subsequently, as illustrated in FIG. 9, the surface layer of the conductive film CF is removed by, for example, chemical mechanical polishing (CMP). In this operation, the conductive film CF is removed until the surface layer of the dielectric film DDL appears over the logic region LR. In other words, the dielectric film DDL functions as a stopper for removal of the conductive film CF (by the CMP, for example). Consequently, the conductive film CF remains over the memory region MR while being removed from the area over the logic region LR. Furthermore, the conductive film CF remains as the plate PL and the filled part BUR over the memory region MR.

Figure 10:
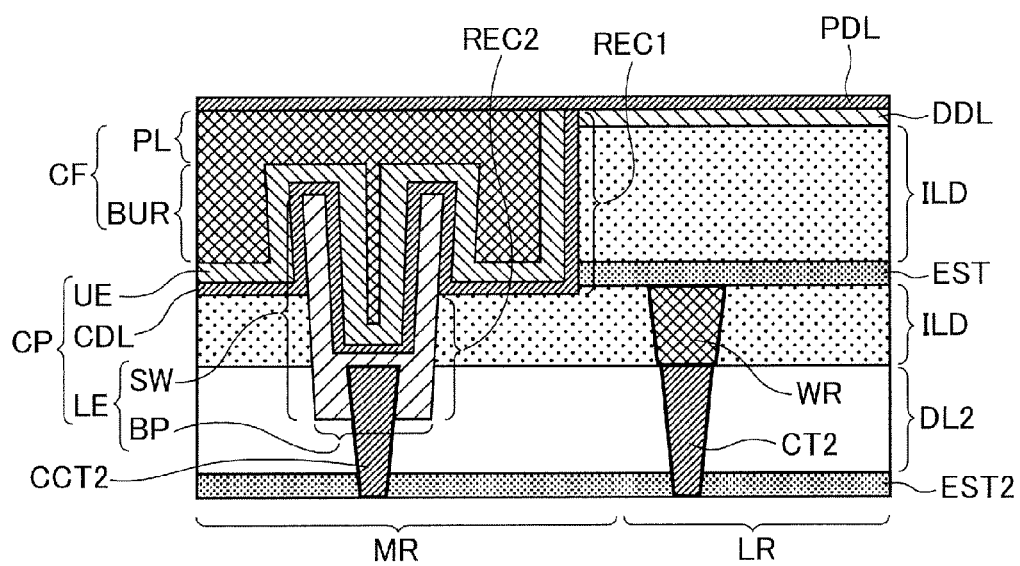
FIG. 10 is a sectional view illustrating the method of manufacturing the semiconductor device illustrated in FIGS. 1 and 2.

Subsequently, as illustrated in FIG. 10, a protective dielectric film PDL is formed over the conductive film CF over the memory region MR and the dielectric film DDL over the logic region LR. The protective dielectric film PDL includes, for example, a silicon nitride (SiN) film.

Figure 11:
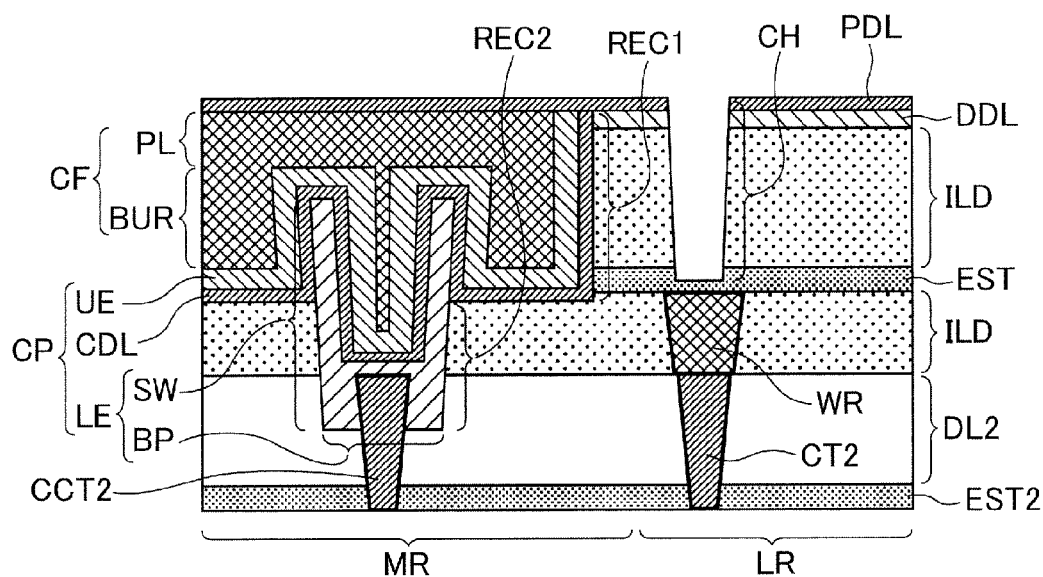
FIG. 11 is a sectional view illustrating the method of manufacturing the semiconductor device illustrated in FIGS. 1 and 2.

Subsequently, as illustrated in FIG. 11, a connection hole CH (third recess) is formed by lithography in the interlayer dielectric film ILD over the logic region LR. The connection hole CH is located in a region that coincides with the interconnection WR in a plan view. In the exemplary case illustrated in FIG. 11, the bottom part of the connection hole CH extends through the interlayer dielectric film ILD into the etching stop layer EST located under the interlayer dielectric film ILD.

In the exemplary case illustrated in FIG. 11, the connection hole CH is formed by etching such as RIE. In such etching, the surface of the plate PL may be oxidized by ions generated by RIE, for example. In the exemplary case illustrated in FIG. 11, however, the surface of the plate PL is covered with the protective dielectric film PDL. This prevents the surface of the plate PL from being oxidized.

Figure 12:
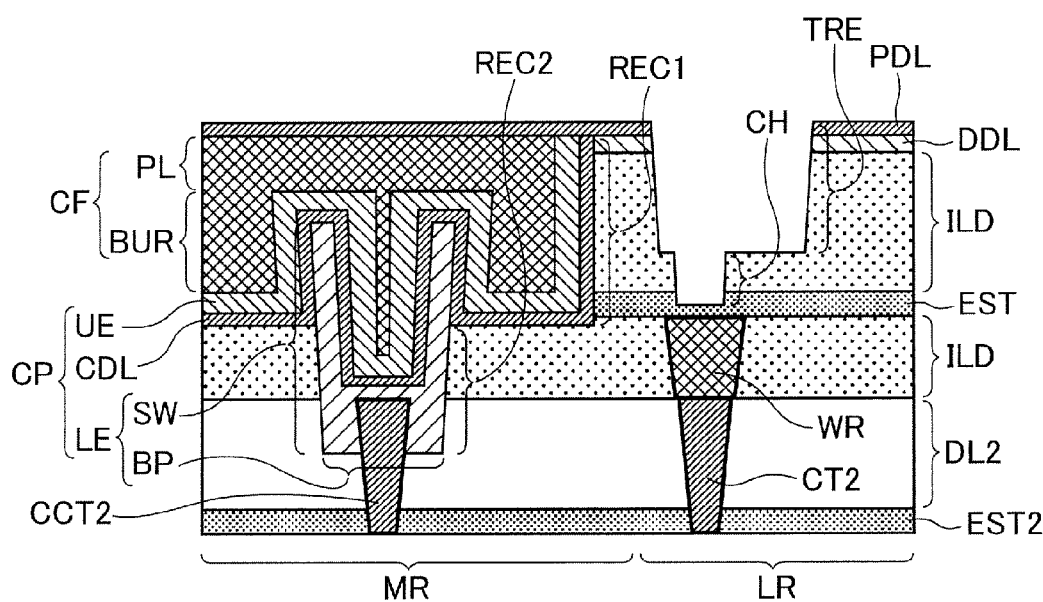
FIG. 12 is a sectional view illustrating the method of manufacturing the semiconductor device illustrated in FIGS. 1 and 2.

Subsequently, as illustrated in FIG. 12, a trench TRE (third recess) is formed by lithography in the interlayer dielectric film ILD over the logic region LR. The trench TRE is formed such that the bottom part thereof communicates with the connection hole CH. The trench TRE is also formed by etching such as RIE as with the connection hole CH. The protective dielectric film PDL on the plate PL also prevents oxidization of the plate PL during such etching in the same way as described above.

Figure 13:
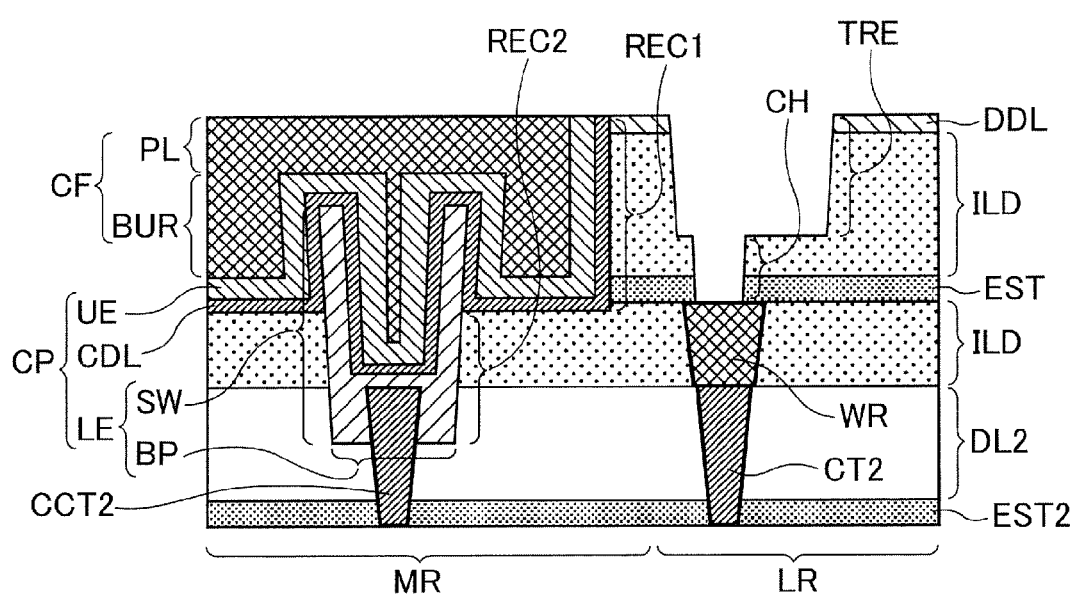
FIG. 13 is a sectional view illustrating the method of manufacturing the semiconductor device illustrated in FIGS. 1 and 2.

Subsequently, as illustrated in FIG. 13, a certain portion of the etching stop layer EST, into which the bottom part of the connection hole CH extends, and the protective dielectric film PDL are etched back and removed. In the step illustrated in FIG. 13, the portion of the etching stop layer EST, into which the bottom part of the connection hole CH extends (FIG. 12), may have a thickness larger than the protective dielectric film PDL. Furthermore, the protective dielectric film PDL and the etching stop layer EST may be composed of the same material. In such a case, even if the protective dielectric film PDL is entirely removed by the etching back, such a portion of the etching stop layer EST remains. Consequently, the interconnection (interconnection WR) located under the etching stop layer EST is prevented from being etched.

Figure 14:
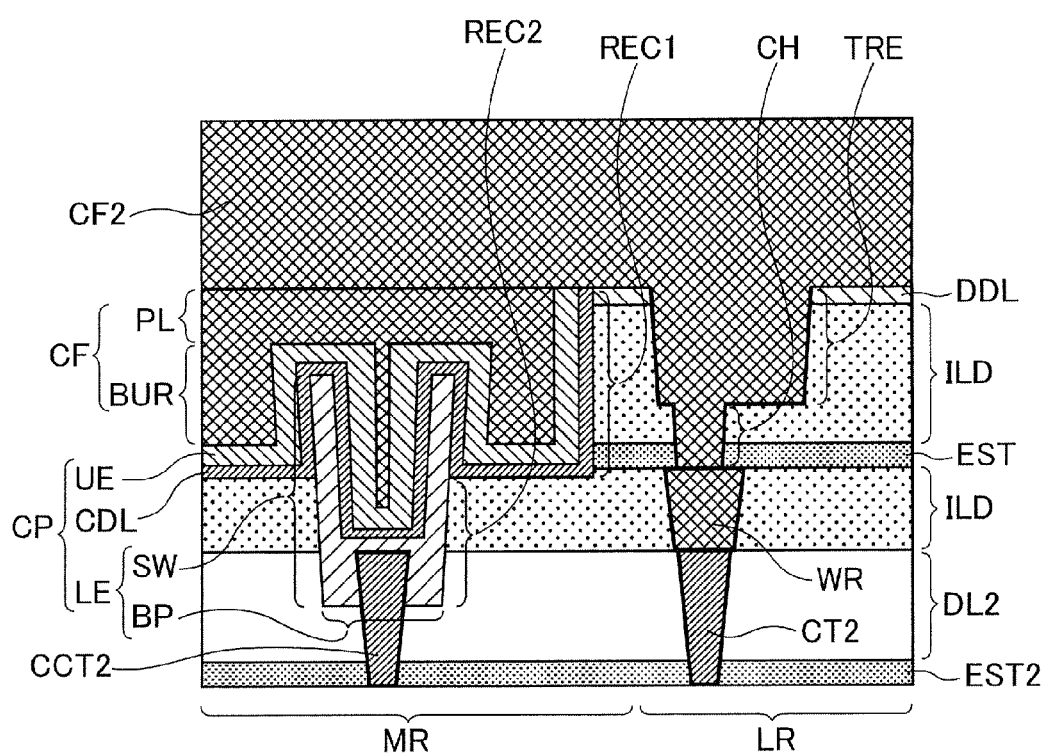
FIG. 14 is a sectional view illustrating the method of manufacturing the semiconductor device illustrated in FIGS. 1 and 2.

Subsequently, as illustrated in FIG. 14, the conductive film CF2 is formed over the interlayer dielectric film ILD. In this operation, the conductive film CF2 covers the plate PL over the memory region MR, while some of the conductive film CF2 fills the trench TRE and the connection hole CH over the logic region LR. To describe in detail later, the conductive film CF2 acts as the interconnection LWR in the trench TRE, and acts as the via LVA in the connection hole CH. The conductive film CF2 is composed of, for example, the same material as that for the plate PL (for example, copper alloy).

Figure 15:
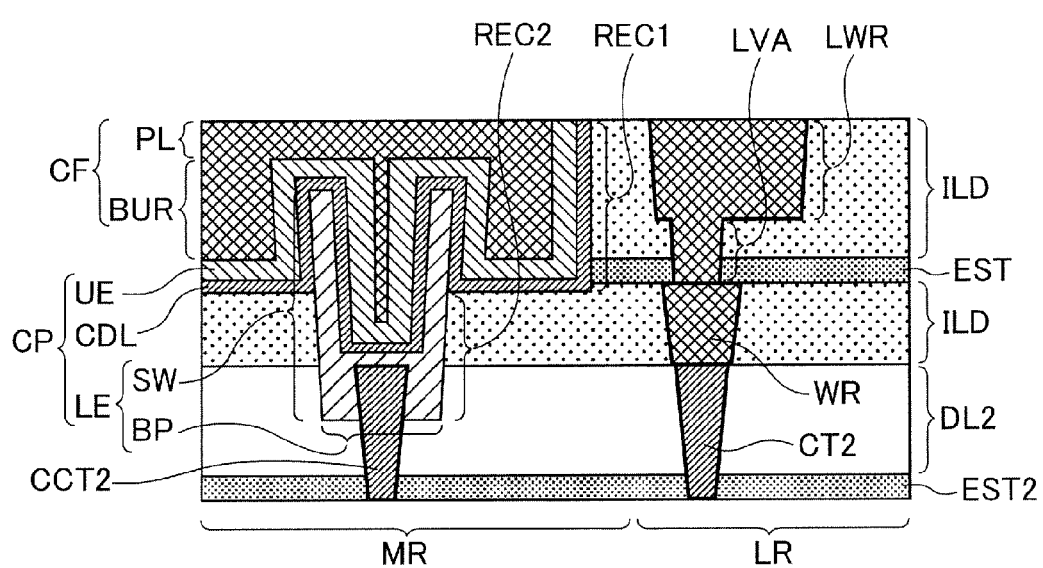
FIG. 15 is a sectional view illustrating the method of manufacturing the semiconductor device illustrated in FIGS. 1 and 2.

Subsequently, as illustrated in FIG. 15, the surface layer of the conductive film CF2 is removed by, for example, CMP. Consequently, the conductive film CF2 is removed and the surface of the plate PL is exposed over the memory region MR. On the other hand, the conductive film CF2 is removed over the logic region LR except for a portion filling the trench TRE and the connection hole CH. Consequently, the interconnection LWR is formed in the trench TRE, while the via LVA is formed in the connection hole CH. Furthermore, the top of the plate PL becomes flush with the top of the interconnection LWR. In the exemplary case illustrated in FIG. 15, the dielectric film DDL over the logic region LR is also removed.

Figure 16:
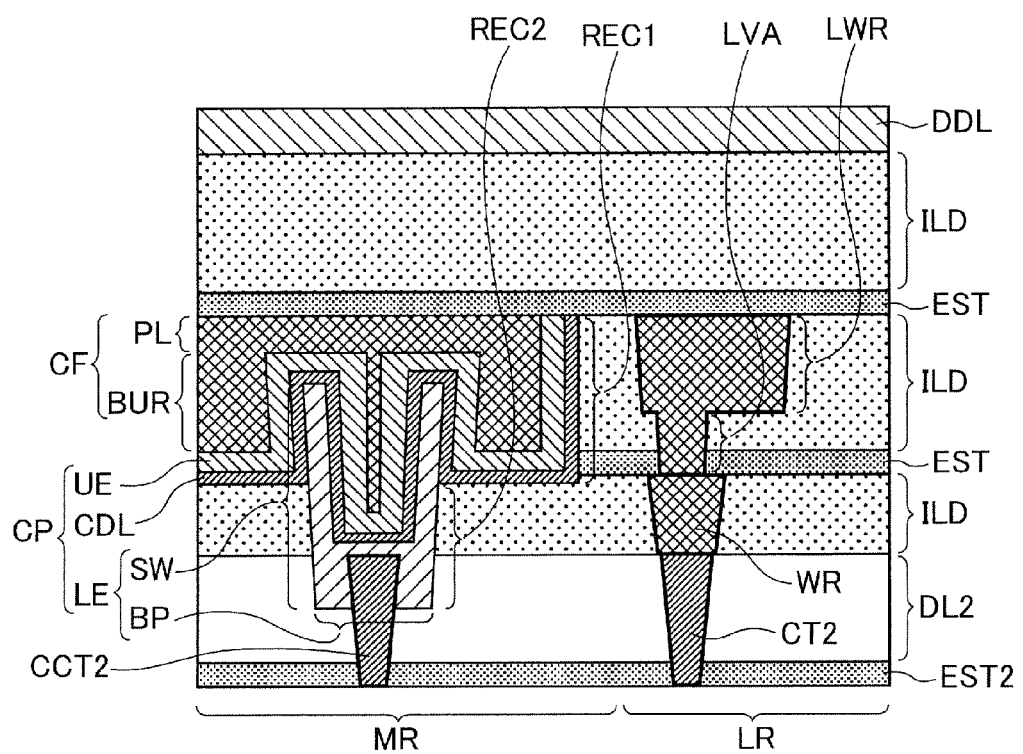
FIG. 16 is a sectional view illustrating the method of manufacturing the semiconductor device illustrated in FIGS. 1 and 2.

Subsequently, as illustrated in FIG. 16, the etching stop layer EST, the interlayer dielectric film ILD, and the dielectric film DDL are stacked in this order over the plate PL, the interconnection LWR, and the interlayer dielectric film ILD. Subsequently, the interconnection CWR and the via CVA are formed in the interlayer dielectric film ILD over the memory region MR, and the interconnection LWR and the via LVA are formed in the interlayer dielectric film ILD over the logic region LR. Subsequently, similar steps are repeated. In this way, the semiconductor device SD illustrated in FIGS. 1 and 2 is fabricated.

Thus, according to the first embodiment, as illustrated in FIG. 7, the lower electrode LE and the recess REC1 are formed together. This enables a smaller number of times of lithography.

Furthermore, according to the first embodiment, the lower electrode LE of the capacitor CP has the sidewall part SW projecting upward from the opening of the recess REC2. This allows the capacitive dielectric film CDL of the capacitor CP to be in contact with the outer wall of the sidewall part SW in addition to the bottom part BP of the lower electrode LE and the inner wall of the sidewall part SW. As a result, it is possible to increase area of a portion that contributes to the capacitor function.

Furthermore, in the first embodiment, the bottom part of the recess REC1 extends through the etching stop layer EST. This makes it possible to increase height of the projecting portion of the sidewall part SW (the projecting portion from the opening of the recess REC2). Consequently, it is possible to effectively increase area of the portion that contributes to the capacitor function. When the bottom part of the recess REC1 merely extends into the etching stop layer EST instead of extending through the etching stop layer EST, similar effects are also exhibited.

Furthermore, according to the first embodiment, as described above, the outer wall of the projecting portion of the sidewall part SW of the lower electrode LE of the capacitor CP also contributes to the capacitor function. In such a case, even if a distance from the upper end of the sidewall part SW to the opening of the recess REC1 is somewhat large, the capacitor CP has the necessary capacitance. In such a case, the plate PL is allowed to have a large thickness. Since the plate PL has a large width, dishing tends to occur in the plate PL during formation of the plate PL by, for example, CMP. In addition, when the plate PL has a small thickness, the plate PL may be broken due to such dishing. In the first embodiment, however, it is possible to effectively prevent such breaking of the plate PL. Such an effect is particularly effectively exhibited for the thickness of the plate PL of 10 to 300 nm.

Furthermore, according to the first embodiment, the step of forming the plate PL (FIG. 9) and the step of forming the interconnection (interconnection LWR) in the same layer as the plate PL (FIG. 15) are performed at different timings. The plate PL has a width larger than the interconnection LWR. When the surface layers of the conductive members having such different widths are removed together by, for example, CMP, dishing typically occurs in a conductive member having a relatively large width (plate PL). According to the first embodiment, however, such dishing is effectively prevented.

Second Embodiment

Figure 17:
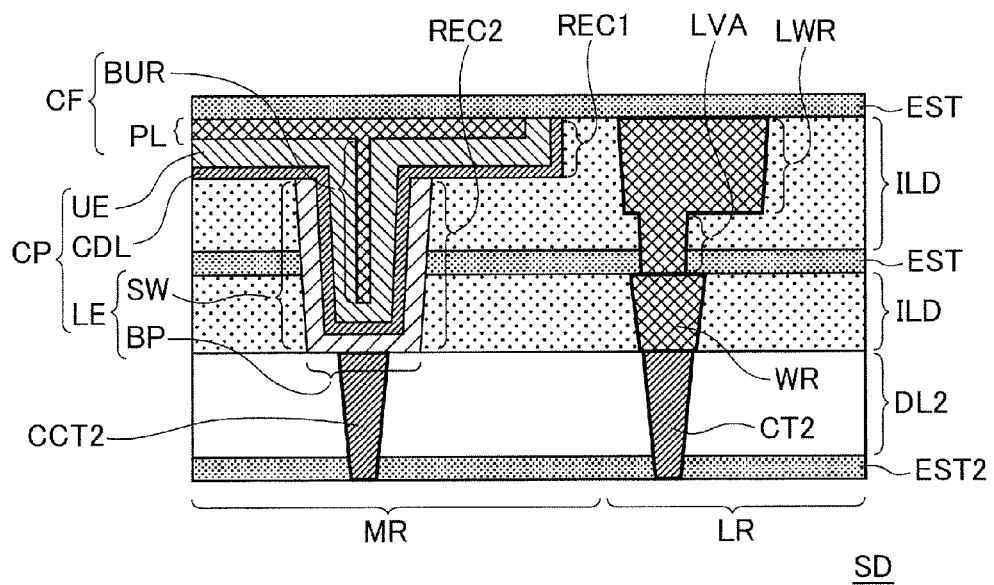
FIG. 17 is a sectional view illustrating a configuration of a semiconductor device according to a second embodiment.

FIG. 17 is a sectional view illustrating a configuration of a semiconductor device SD according to a second embodiment, which corresponds to FIG. 2 in the first embodiment. The semiconductor device SD according to the second embodiment has a configuration similar to that of the semiconductor device SD according to the first embodiment except for a configuration of the capacitor CP.

In detail, the recesses REC1 and REC2 are provided in the double interlayer dielectric films ILD located lowest in the interconnection layer IL. The recess REC1 is provided in the upper interlayer dielectric film ILD of the double interlayer dielectric films ILD. In this configuration, the bottom of the recess REC1 is located above the bottom of the upper interlayer dielectric film ILD. In other words, the recess REC1 does not extend through the upper interlayer dielectric film ILD. The recess REC2 is provided on the bottom of the recess REC1. The recess REC2 extends through the bottom of the interlayer dielectric film ILD having the recess REC1 and through the interlayer dielectric film ILD (the lowest interlayer dielectric film ILD of the interconnection layer IL) located under the interlayer dielectric film ILD having the recess REC1.

As with the first embodiment, the capacitor CP has the lower electrode LE, the capacitive dielectric film CDL, the upper electrode UE, and the conductive film CF. The capacitor CP is formed using the recesses REC1 and REC2.

The lower electrode LE has the bottom part BP and the sidewall part SW as with the first embodiment. The bottom part BP is provided along the bottom of the recess REC2. The sidewall part SW is provided along the inner side face of the recess REC2. In the exemplary case illustrated in FIG. 17, the upper end of the sidewall part SW is flush with the bottom of the recess REC1. The upper end of the sidewall part SW may be located below the bottom of the recess REC1. The lower electrode LE is composed of a material similar to that of the first embodiment (for example, titanium nitride (TiN)).

The capacitive dielectric film CDL covers the lower electrode LE within the recess REC2, and covers the bottom part of the recess REC1. In the exemplary case illustrated in FIG. 17, the capacitive dielectric film CDL is provided along the bottom part BP of the lower electrode LE, the inner wall of the sidewall part SW of the lower electrode LE, and the bottom part of the recess REC1. The capacitive dielectric film CDL is composed of a material similar to that of the first embodiment (for example, a high-k material such as zirconia ($ZrO_2$)).

The upper electrode UE covers the capacitive dielectric film CDL. In the exemplary case illustrated in FIG. 17, the upper electrode UE is provided along the bottom part BP of the lower electrode LE, the inner wall of the sidewall part SW of the lower electrode LE, and the bottom part of the recess REC1. The upper electrode UE is composed of a stacked film (Ta/TaN/W/TiN) including materials similar to those in the first embodiment, i.e., titanium nitride (TiN), tungsten (W), tantalum nitride (TaN), and tantalum (Ta) stacked in order of closeness to the capacitive dielectric film CDL.

The conductive film CF covers the upper electrode UE of the capacitor CP. The conductive film CF is provided as a flat plate PL over the upper electrode UE. The conductive film CF partially fills the recess REC2 (forms the filled part BUR). The conductive film CF is composed of a material similar to that (copper alloy) of the first embodiment.

Figure 18:
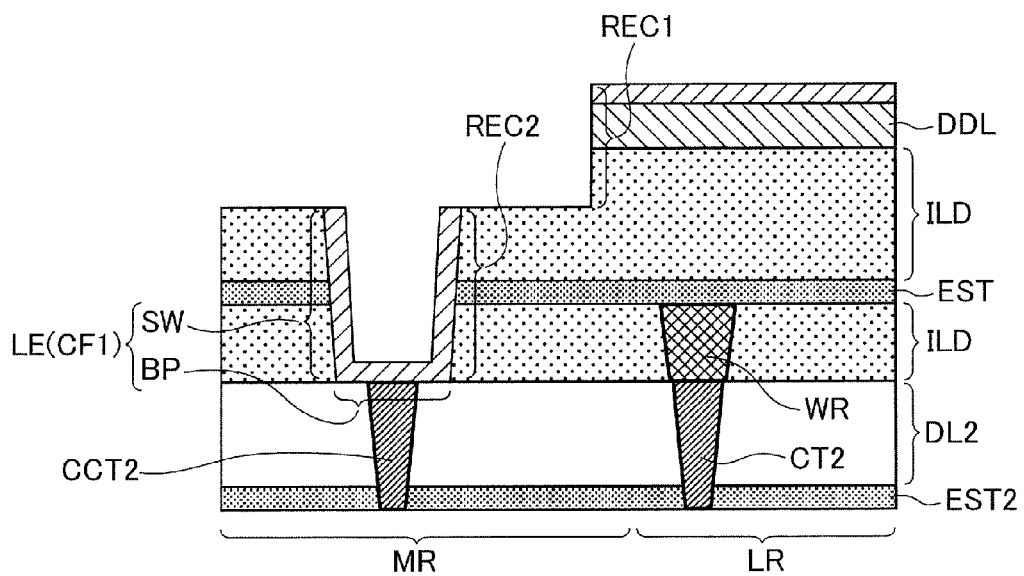
FIG. 18 is a sectional view illustrating a method of manufacturing the semiconductor device illustrated in FIG. 17.
Figure 19:
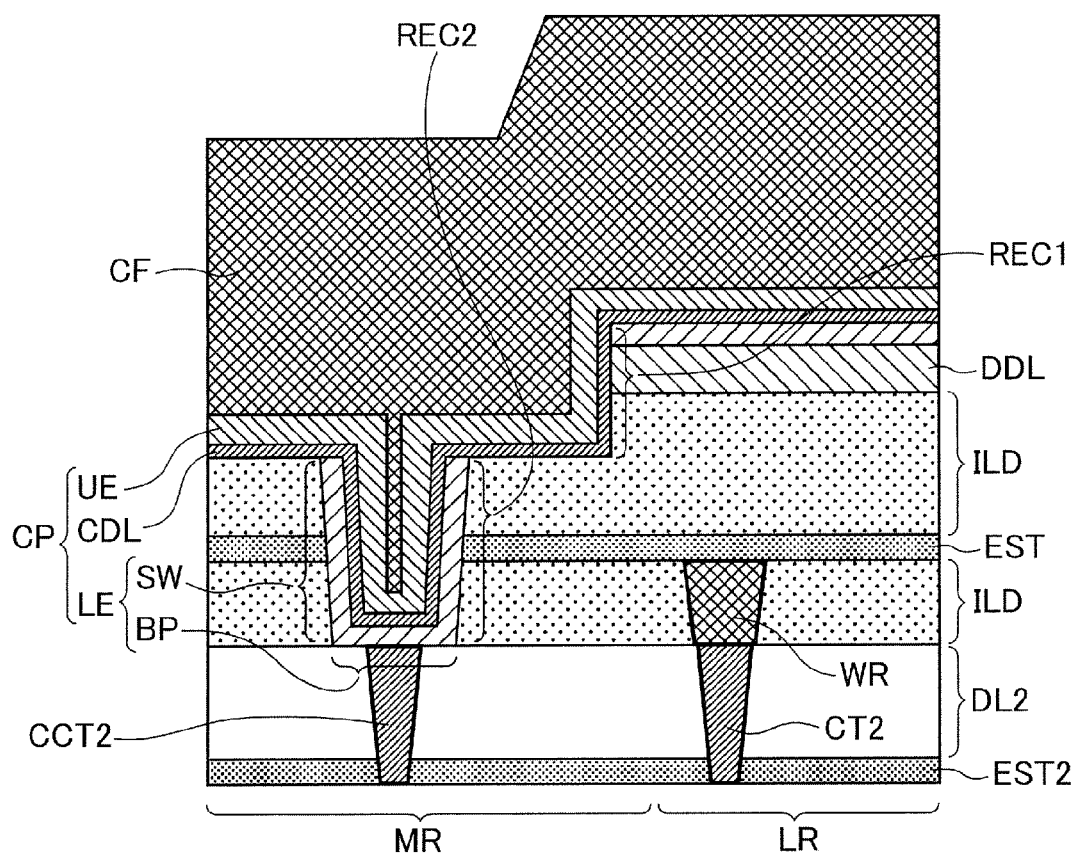
FIG. 19 is a sectional view illustrating the method of manufacturing the semiconductor device illustrated in FIG. 17.
Figure 20:
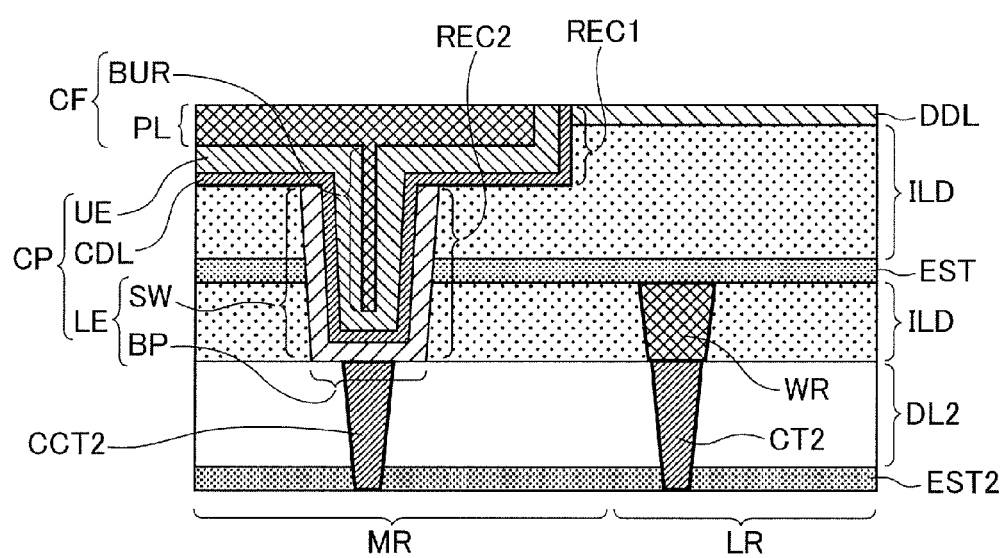
FIG. 20 is a sectional view illustrating the method of manufacturing the semiconductor device illustrated in FIG. 17.

FIGS. 18 to 20 are each a sectional view illustrating a method of manufacturing the semiconductor device SD illustrated in FIG. 17. First, the steps illustrated in FIGS. 3 to 6 are performed as with the first embodiment.

Subsequently, as illustrated in FIG. 18, etching is performed using the resist pattern shown in FIG. 6 as a mask, so that the conductive film CF1 is partially removed, and the recess REC1 is formed in the interlayer dielectric film ILD. In other words, partial removal of the conductive film CF1 and formation of the recess REC1 are performed together. Consequently, the conductive film CF1 remaining over the memory region MR functions as the lower electrode LE. For example, RIE is performed as the etching. Subsequently, the resist pattern is removed by, for example, asking. In the exemplary case illustrated in FIG. 18, the upper end of the lower electrode LE (sidewall part SW) is flush with the bottom of the recess REC1. However, the upper end of the lower electrode LE (sidewall part SW) may be located below the bottom of the recess REC1.

Subsequently, as illustrated in FIG. 19, the capacitive dielectric film CDL, the upper electrode UE, and the conductive film CF are stacked in this order.

Subsequently, as illustrated in FIG. 20, the surface layer of the conductive film CF is removed by, for example, CMP. In this operation, the conductive film CF is removed until the surface layer of the dielectric film DDL appears over the logic region LR. Consequently, the conductive film CF remains over the memory region MR while being removed from the area over the logic region LR. Furthermore, the conductive film CF remains as the plate PL and the filled part BUR over the memory region MR.

Subsequently, as with the first embodiment, the interconnection LWR and the via LVA are formed in the interlayer dielectric film ILD in the same layer as the plate PL. Subsequently, the interconnection layer IL is formed over the plate PL as with the first embodiment. In this way, the semiconductor device SD illustrated in FIG. 17 is fabricated.

Thus, according to the second embodiment, as illustrated in FIG. 18, the lower electrode LE and the recess REC1 are formed together. This enables a smaller number of times of lithography as with the first embodiment.

Modification 1

The semiconductor device SD according to Modification 1 has a configuration similar to that of the semiconductor device SD according to the first embodiment except for a material for the upper electrode UE of the capacitor CP and a material for the conductive film CF. In detail, the upper electrode UE of the Modification 1 is composed of titanium nitride (TiN). The conductive film CF is composed of tungsten (W). In the Modification 1, the interconnection LWR and the via LVA in the same layer as the plate PL (conductive film CF) may each be composed of the same material as that for the conductive film CF or composed of a material (for example, copper) different from the material for the conductive film CF. The Modification 1 also provides effects similar to those of the first embodiment.

Modification 2

The semiconductor device SD according to Modification 2 has a configuration similar to that of the semiconductor device SD according to the first embodiment except for a material for the upper electrode UE of the capacitor CP and a material for the conductive film CF. In detail, the upper electrode UE in the Modification 2 is composed of a stacked film (Ta/TaN) including tantalum nitride (TaN) and tantalum (Ta) stacked in order of closeness to the capacitive dielectric film CDL. The conductive film CF is composed of copper alloy. The Modification 2 also provides effects similar to those of the first embodiment.

Modification 3

The semiconductor device SD according to Modification 3 has a configuration similar to that of the semiconductor device SD according to the first embodiment except for a material for the upper electrode UE of the capacitor CP and a material for the conductive film CF. In detail, the upper electrode UE of the Modification 3 is composed of a stacked film (Ta/TaN/TiN) including titanium nitride (TiN), tantalum nitride (TaN) and tantalum (Ta) stacked in order of closeness to the capacitive dielectric film CDL. The conductive film CF is composed of copper alloy. The Modification 3 also provides effects similar to those of the first embodiment.

Modification 4

The semiconductor device SD according to Modification 4 has a configuration similar to that of the semiconductor device SD according to the first embodiment except for a material for the upper electrode UE of the capacitor CP and a material for the conductive film CF. In detail, the upper electrode UE in the Modification 4 is composed of a stacked film (Ti/TiN) including titanium nitride (TiN) and titanium (Ti) stacked in order of closeness to the capacitive dielectric film CDL. The conductive film CF is composed of copper alloy. The Modification 4 also provides effects similar to those of the first embodiment.

Modification 5

The semiconductor device SD according to Modification 5 has a configuration similar to that of the semiconductor device SD according to the second embodiment except for a material for the upper electrode UE of the capacitor CP and a material for the conductive film CF. In detail, the upper electrode UE in the Modification 5 is composed of titanium nitride (TiN). The conductive film CF is composed of tungsten (W). In the Modification 5, the interconnection LWR and the via LVA in the same layer as the plate PL (conductive film CF) may each be composed of the same material as that for the conductive film CF or composed of a material (for example, copper) different from the material for the conductive film CF. The Modification 5 also provides effects similar to those of the second embodiment.

Modification 6

The semiconductor device SD according to Modification 6 has a configuration similar to that of the semiconductor device SD according to the second embodiment except for a material for the upper electrode UE of the capacitor CP and a material for the conductive film CF. In detail, the upper electrode UE in the Modification 6 is composed of a stacked film (Ta/TaN) including tantalum nitride (TaN) and tantalum (Ta) stacked in order of closeness to the capacitive dielectric film CDL. The conductive film CF is composed of copper alloy. The Modification 6 also provides effects similar to those of the second embodiment.

Although the invention achieved by the inventors has been described in detail according to some embodiments hereinbefore, the invention should not be limited thereto, and it will be appreciated that various modifications or alterations thereof may be made within the scope without departing from the gist of the invention.

What is claimed is:

1. A semiconductor device, comprising:
   a substrate;
   a first transistor provided in the substrate;
   a second transistor provided in the substrate;
   a first interlayer dielectric film located over the substrate;

a second interlayer dielectric film located over the first interlayer dielectric film;
a first recess having an opening in a surface of the second interlayer dielectric film and a bottom on the first interlayer dielectric film;
a second recess that has an opening at the bottom of the first recess, and is at least partially located in the first interlayer dielectric film;
a capacitor that is formed using the first recess and the second recess, and is electrically coupled to one of a source and a drain of the first transistor; and
a conductive member that is formed in the second interlayer dielectric film, and is electrically coupled to one of a source and a drain of the second transistor,
the capacitor including:
a lower electrode having a bottom part along a bottom of the second recess, and a sidewall part along a side face of the second recess, the sidewall part having an upper end portion that projects from the opening of the second recess to a position that is between the opening of the second recess and a top of the second interlayer dielectric film,
a capacitive dielectric film covering the bottom part of the lower electrode and an inner wall of the sidewall part of the lower electrode, and covering an outer wall of a portion of the sidewall part, the portion projecting from the opening of the second recess,
an upper electrode covering the capacitive dielectric film, and
a conductive plate located over the upper electrode,
a top of the conductive plate being flush with a top of the conductive member.

2. The semiconductor device according to claim 1, wherein the conductive plate has a thickness of 10 to 300 nm.

3. A semiconductor device, comprising:
a substrate;
a first transistor provided in the substrate;
a second transistor provided in the substrate;
a first interlayer dielectric film located over the substrate;
a second interlayer dielectric film located over the first interlayer dielectric film;
a first recess having an opening in a surface of the second interlayer dielectric film and a bottom on the first interlayer dielectric film;
a second recess that has an opening at the bottom of the first recess, and is at least partially located in the first interlayer dielectric film;
a capacitor that is formed using the first recess and the second recess, and is electrically coupled to one of a source and a drain of the first transistor; and
a conductive member that is formed in the second interlayer dielectric film, and is electrically coupled to one of a source and a drain of the second transistor,
the capacitor including:
a lower electrode having a bottom part along a bottom of the second recess, and a sidewall part along a side face of the second recess, the sidewall part having an upper end portion that projects from the opening of the second recess to a position that is between the opening of the second recess and a top of the second interlayer dielectric film,
a capacitive dielectric film covering the bottom part of the lower electrode and an inner wall of the sidewall part of the lower electrode, and covering an outer wall of a portion of the sidewall part, the portion projecting from the opening of the second recess,
an upper electrode covering the capacitive dielectric film, and
a conductive plate located over the upper electrode,
a top of the conductive plate being flush with a top of the conductive member, and the semiconductor device further comprising:
an etching stop layer that is located between the first interlayer dielectric film and the second interlayer dielectric film, and is composed of a material different from a material for each of the first interlayer dielectric film and the second interlayer dielectric film, and
wherein a bottom part of the first recess extends into the etching stop layer, or extends through the etching stop layer.

4. The semiconductor device according to claim 3, wherein a bottom part of the conductive member extends through the etching stop layer.

5. A semiconductor device, comprising:
a substrate with first and second transistors;
a first interlayer dielectric film disposed over the substrate in a thickness direction;
a second interlayer dielectric film disposed over the first interlayer dielectric film;
a first recess having a first opening and a first bottom, the first opening being in an upper surface of the second interlayer dielectric film and the first bottom being below the first opening in the thickness direction;
a second recess having a second opening and a second bottom, the second opening being at the first bottom of the first recess, the second recess extending at least partially through the first interlayer dielectric film;
a capacitor formed by the first and second recesses, the capacitor being electrically coupled to the first transistor; and
a conductive member formed in the second interlayer dielectric film, the conductive member being electrically coupled to the second transistor,
wherein the capacitor includes lower and upper electrodes, a capacitive dielectric film, and a conductive plate,
wherein the lower electrode is formed over sidewalls and the second bottom of the second recess,
wherein the lower electrode includes an upper end portion extending from the second opening into the first recess, the upper end portion being between the second opening and a top of the second interlayer dielectric film in the thickness direction,
wherein the capacitive dielectric film covers the lower electrode,
wherein the upper electrode covers the capacitive dielectric film,
wherein the conductive plate is located over the upper electrode in the thickness direction, and
wherein a width of the first bottom of the first recess is greater than a width of the second opening of the second recess.

6. The semiconductor device according to claim 5, wherein a top of the conductive plate is aligned with a top of the conductive member in the thickness direction.

7. The semiconductor device according to claim 5, further comprising an etching stop layer disposed between the first interlayer dielectric film and the second interlayer dielectric film,
wherein the etching stop layer is composed of a material different from that of the first and second interlayer dielectric films, and wherein the first recess extends into or through the etching stop layer.

8. The semiconductor device according to claim 7, wherein the conductive member extends through the etching stop layer.

9. The semiconductor device according to claim 5, wherein the conductive plate has a thickness of 10 to 300 nm.

* * * * *